United States Patent [19]

Suzuki

[11] 4,381,338

[45] Apr. 26, 1983

[54] PROCESS FOR PREPARING PHOTOCONDUCTIVE PARTICLES

[75] Inventor: Kiyoshi Suzuki, Yokohama, Japan

[73] Assignee: Canon Kabushiki Kaisha, Tokyo, Japan

[21] Appl. No.: 188,229

[22] Filed: Sep. 17, 1980

[30] Foreign Application Priority Data

Sep. 21, 1979 [JP] Japan ................................ 54-121750

[51] Int. Cl.³ ............................................. G03G 5/08
[52] U.S. Cl. ..................................... 430/135; 430/94; 430/95; 210/665; 210/666
[58] Field of Search ....................... 430/133, 134, 135; 210/665, 666, 777, 778

[56] References Cited

U.S. PATENT DOCUMENTS

| | | | |
|---|---|---|---|
| 3,486,889 | 12/1969 | Bobalek et al. ................. | 430/135 X |
| 3,634,333 | 1/1972 | Tamai et al. ......................... | 430/135 |
| 4,043,813 | 8/1977 | Logue et al. ......................... | 430/90 |
| 4,183,748 | 1/1980 | Murai et al. ......................... | 430/135 |

FOREIGN PATENT DOCUMENTS

| | | | |
|---|---|---|---|
| 1005246 | 9/1965 | United Kingdom .................. | 430/89 |
| 1031864 | 6/1966 | United Kingdom .................. | 430/95 |

*Primary Examiner*—Roland E. Martin, Jr.
*Attorney, Agent, or Firm*—Fitzpatrick, Cella, Harper & Scinto

[57] ABSTRACT

Photoconductive particles are prepared by the reaction of a water-soluble metal salt with an ion exchange resin having an anion which reacts with the metal ion of the water-soluble metal salt to produce a water insoluble metal compound and the deposition of the water insoluble metal compound resulting from the reaction on the surface of the photoconductive particles.

6 Claims, No Drawings

PROCESS FOR PREPARING PHOTOCONDUCTIVE PARTICLES

BACKGROUND OF THE INVENTION

1. Field of the Invention

The present invention relates to a process for preparing photoconductive particles, and more particularly, to a process for preparing photoconductive particles having a water insoluble precipitate on the surface thereof which are prepared by the use of ion exchange resins containing the desired anion, in a process for preparing photoconductive particles which have less forming ghost image or excellent reproducibility in half tone by deposition of a water insoluble metal compound on the surface of the photoconductive particles.

2. Description of the Prior Art

Photoconductive particles are dispersed into a binder, and a photoconductive layer is formed by the resulting mixture. An electrophotographic photosensitive member comprising the photoconductive layer is used, and the characteristics of the photosensitive member depend upon the dispersing condition of the photoconductive particles in the binder, particularly, depending upon the characteristics of the photoconductive particle itself.

Generally, in the case of a photosensitive member using photoconductive particles, contrast of electrostatic images tends to decrease in a high humidity atmosphere. In short, the photoconductive member is not of good humidity resistance. Further, at a high speed copying by an electrophotographic process, it is required that an electrostatic image is formed immediately after an electrostatic image produced in the preceding cycle has disappeared. At this time, it is necessary that the preceding image is eliminated quickly and completely. However, sometimes an image which has not been completely eliminated is overlapping on an electrostatic image to be subsequently formed. In short, a ghost image is formed sometimes.

In the techniques of electrophotographic photosensitive members, the maximum value of the ratio of the change in surface potential ($\Delta V$) to the change of exposure E (hereinafter represented by $\Delta \log E$) is very important. This maximum value is called $\gamma$-value. The above-mentioned relation is represented by the following formula.

$$\left| \frac{\Delta V}{\Delta \log E} \right| \max = \tau$$

The $\gamma$ value has a great effect on the reproducibility of original information during latent image formation in an electrophotographic processes. That is, where $\gamma$ value of a photosensitive member is very high, the resulting latent images are very unstable since the surface potential is very sensitive to even a minor change of exposure and, in particular, latent images corresponding to a light of intermediate intensity are so unstable that the developed images can not contain any half tone (grey) and are of low gradation. On the contrary, where $\gamma$ value is too small, fog is formed and good images can not be obtained.

Therefore, it is desired that photoconductive particles having the desired $\gamma$ value are prepared so as to reproduce half tone satisfactorily.

It is effective for improving humidity resistance, inhibition of ghost image, and reproducibility of half tone that a water insoluble metal compound is deposited on the surface of photoconductive particles as proposed in Japanese Patent Application Nos. 121288/1979 and 121504/1979.

A method of depositing a water insoluble compound on the surface of photoconductive particles according to the two Japanese Patent Applications comprises the addition of water-soluble sulfides, hydroxides, carbonates, or the like to a mixture including the photoconductive particles in an aqueous solution of water-soluble metal salt with stirring, whereby the water-soluble metal salt reacts with the water-soluble sulfides, hydroxides, or carbonates etc., and deposits the resulting water insoluble metal compound on the surface of the particles. However, in this method, water-soluble materials comprising counter ions corresponding to the above-mentioned water insoluble compounds remain in the resulting mixture. Consequently, unnecessary water-soluble materials should be further removed by procedures such as washing with water.

SUMMARY OF THE INVENTION

According to the present invention, there is provided a process for preparing photoconductive particles which comprises a reaction between a water-soluble metal salt and an ion exchange resin having an anion which reacts with the metal ion of the water-soluble metal salt to produce a water insoluble metal compound, and a deposition of the insoluble metal compound resulting from the reaction on the surface of the photoconductive particles.

It is a primary object of the present invention to provide a process for preparing photoconductive particles in which a water insoluble metal compound is deposited on the surface of photoconductive particles without a washing step with ease.

It is a further object of the present invention to provide a process for preparing photoconductive particles in which a small amount of a water-soluble salt existing on the surface of the photoconductive particles is changed to a water insoluble compound simultaneously with the reaction.

DESCRIPTION OF THE PREFERRED EMBODIMENTS

An ion exchange resin is added to a solution of a water-soluble metal salt containing photoconductive particles. By this procedure, the counter ion to the metal ion of the water-soluble metal salt is exchanged with the anion of an ion exchange resin and a reaction occurs between the metal ion and the exchanged anion which was the anion of the ion exchange resin, and then a precipitate of the resulting water insoluble metal compound is formed and deposited on the surface of the photoconductive particles. The anion in the ion exchange resin is replaced by the counter ion of the metal salt, and thereafter a reaction occurs between the metal ion and the anion which was exchanged with the counter ion. Consequently, an amount of the anion in the solution which results from the ion exchange resin is equal to an amount of the counter-ion, and reacts with the metal ion which preliminarily exists in the solution in an ionic equivalent manner, and the resulting compound is allowed to deposit on the surface of the photoconductive particles. For this reason, water-soluble ion is neither newly generated by the above-mentioned reaction, nor remains in the solution. Therefore, a water washing step for removing impurity is unnecessary.

Further, in the case that where the anion of a small amount of a water-soluble metal salt present on the surface of the photoconductive particles is exchanged with the anion of the ion exchange resin and the water-soluble metal salt is converted into an insoluble metal compound, the procedure according to the present invention also serves as a method of washing the surface of the photoconductive particles. For example, in the case of cadmium sulfide, a small amount of cadmium sulfate is present on the surface of cadmium sulfide. However, the cadmium sulfate reacts with an ion exchange resin, for example, which is exchanged by hydroxyl group, and then water insoluble cadmium hydroxide is formed as shown in the following reaction formula. Consequently, the procedure performs also compensation of defect on the surface of the cadmium sulfide.

$$CdSO_4 + 2R-(OH) \rightarrow Cd(OH)_2 + R_2-SO_4$$

In the above formula, R represents an ion exchange resin.

The metal elements of the metal salts used in the present invention may be suitably selected from metal elements capable of forming a water insoluble metal compound. As a typical metal, there may be mentioned cadmium, iron, cobalt, nickel, aluminium, indium, zinc, and the like. Anions to be contained in ion exchange resin which produce water insoluble metal compounds may be suitably selected. Hydroxyl group, carbonate ion, sulfide ion and the like are preferable. Particularly, hydroxyl group is more preferable in consideration of the selection of an ion exchange resin. Insoluble metal salts formed by the above-mentioned anions are metal hydroxide, metal carbonate and metal sulfide. As typical insoluble metal salts, there are mentioned $Cd(OH)_2$, $Fe(OH)_3$, $Al(OH)_3$, $In(OH)_3$, $Zn(OH)_2$, $CdCO_3$, $CdS$, $ZnS$, $Al_2S_3$, $In_2S_3$, and the like.

EXAMPLE 1

To 30 g. of CdS and an aqueous solution of 1 liter containing $10^{-3}$ mole of $CdSO_4$ was added 10 ml of ion exchange resin (tradename SA-10A), supplied by Mitsubishi Kasei Co., Ltd) exchanged by hydroxyl group and the ion exchange reaction was carried out with stirring for 30 minutes. Then, the ion exchange resin was separated by a screen of 100 mesh. The resulting filtrate was filtered off and the resulting precipitate was dried at 70° C. The precipitate in dryness was dispersed into a resin comprising vinyl chloride-vinyl acetate copolymer, and applied to an aluminum substrate. The resulting plate was dried at 70° C., and a polyester film was stuck on the plate to prepare a three-layered photosensitive member. When images were formed at intervals of two seconds on the photosensitive member which was applied to a copying machine based on a basic process comprising primary charge, AC corona discharge contemporaneous exposure, and whole surface exposure, ghost image was not observed and the image was excellent in quality. Ghost image was observed when CdS treated with $CdSO_4$ without ion exchange resin was used.

EXAMPLE 2

Repeating the procedure of Example 1 except that $10^{-5}$ mole of ferric chloride was used in place of $CdSO_4$, there was obtained a photosensitive member which was excellent in reproducibility of half tone especially.

EXAMPLE 3

Repeating the procedure of Example 1 except that $10^{-3}$ mole of $Al_2(SO_4)_3$ was used in place of $CdSO_4$, there were obtained images of high quality and free from ghost image as in Example 1.

EXAMPLE 4

Repeating the procedure of Example 1 except that 10 ml of ion exchange resin exchanged by carbonate ion was used in place of that exchanged by hydroxyl group, high quality images free from ghost images were formed.

What I claim is:

1. A process for preparing cadmium sulfide photoconductive particles comprising:
reacting a water-soluble metal salt with an ion exchange resin having an anion which reacts with the metal ion of the water-soluble metal salt to produce a water insoluble metal compound and depositing the water insoluble metal compound resulting from the reaction on the surface of cadmium sulfide photoconductive particles.

2. A process for preparing cadmium sulfide photoconductive particles according to claim 1 in which the water insoluble metal compound is selected from the group consisting of hydroxides, carbonates and sulfides of cadmium, iron, cobalt, nickel, aluminium, indium and zinc.

3. A process for preparing cadmium sulfide photoconductive particles according to claim 1, wherein the ion exchange resin is added to a solution of the water-soluble metal salt containing the cadmium sulfide photoconductive particles.

4. A process for preparing cadmium sulfide photoconductive particles according to claim 1, wherein the water-soluble salt is deposited on the surface of the cadmium sulfide photoconductive particles.

5. A process for preparing cadmium sulfide photoconductive particles according to claim 1, wherein the anion is a hydroxy group.

6. A process for preparing cadmium sulfide photoconductive particles according to claim 1, wherein the water-insoluble metal compound is a member selected from the group consisting of $Cd(OH)_2$, $Fe(OH)_2$, $Al(OH)_3$, $In(OH)_3$, $Zn(OH)_2$, $CdCO_3$, $CdS$, $ZnS$, $Al_2S_3$ and $InS_3$.

* * * * *